United States Patent [19]

Fisher

[11] 4,313,070

[45] Jan. 26, 1982

[54] SINGLE CRYSTAL METAL WEDGES FOR SURFACE ACOUSTIC WAVE PROPAGATION

[75] Inventor: Edward S. Fisher, Wheaton, Ill.

[73] Assignee: The United States of America as represented by the United States Department of Energy, Washington, D.C.

[21] Appl. No.: 148,313

[22] Filed: May 9, 1980

[51] Int. Cl.[3] .............................................. H01L 41/08

[52] U.S. Cl. ................................ 310/313 R; 310/336; 73/627; 73/644

[58] Field of Search ................................ 310/334–336, 310/313 R; 73/596, 620, 624, 627, 632, 642, 644; 333/150, 154, 141

[56] References Cited

U.S. PATENT DOCUMENTS

| | | | |
|---|---|---|---|
| 2,912,854 | 11/1959 | Schubring | 310/313 R |
| 3,515,911 | 6/1970 | Byram et al. | 310/313 R |
| 3,654,500 | 4/1972 | Claiborne | 310/313 R |

*Primary Examiner*—Mark O. Budd
*Attorney, Agent, or Firm*—Paul A. Gottlieb; Richard G. Besha; James E. Denny

[57] ABSTRACT

An ultrasonic testing device has been developed to evaluate flaws and inhomogeneities in the near-surface region of a test material. A metal single crystal wedge is used to generate high frequency Rayleigh surface waves in the test material surface by conversion of a slow velocity, bulk acoustic mode in the wedge into a Rayleigh wave at the metal-wedge test material interface. Particular classes of metals have been found to provide the bulk acoustic modes necessary for production of a surface wave with extremely high frequency and angular collimation. The high frequency allows flaws and inhomogeneities to be examined with greater resolution. The high degree of angular collimation for the outgoing ultrasonic beam permits precision angular location of flaws and inhomogeneities in the test material surface.

5 Claims, 3 Drawing Figures

SINGLE CRYSTAL METAL WEDGES FOR SURFACE ACOUSTIC WAVE PROPAGATION

CONTRACTUAL ORIGIN OF THE INVENTION

The United States Government has rights in this invention pursuant to Contract No. W-31-109-Eng-38 between the U.S. Department of Energy and Argonne National Laboratory.

BACKGROUND OF THE INVENTION

This invention represents an improvement in devices which utilize ultrasonic waves to detect defects and inhomogeneities in solid materials. In particular, the invention is concerned with the use of surface elastic waves, particularly Rayleigh waves, to examine the near-surface region of a solid material.

Ultrasonic testing of materials has evolved into a major technique for non-destructive testing of materials. One area of ultrasonic testing concerns the examination of the near-surface region of a material for flaws or inhomogeneities through the use of Rayleigh waves as the ultrasonic probe. Rayleigh waves are constrained to travel in the material at the free surface boundaries with the wave penetrating to a depth of approximately one wavelength from the surface. By monitoring changes in the transmitted sound wave spectrum, the nature and extent of flaws or inhomogeneities in a solid may be determined. However, due to the types of materials currently being utilized, the use of Rayleigh waves has been constrained to relatively low frequencies, typically less than 10 MHz with a corresponding lower limit on the wavelength of approximately 300 μm. Acrylic plastic wedges are the predominant, commercially available material used to produce Rayleigh surface waves. The attenuation coefficient is prohibitively large for acoustic modes greater than 10 MHz. As a consequence of this limitation, there is a lower limit on the size of the defect which can be analyzed, and the depth of Rayleigh wave penetration into the solid is so large that limits are placed on the effective layer thickness which can be detected by use of Rayleigh waves. Furthermore, Rayleigh waves of 1-10 MHz frequency have a rather substantial inherent angular divergence upon transmission from the source crystal, thereby limiting the angular sensitivity of an ultrasonic testing device utilizing such low frequency acoustic waves.

Other techniques used to generate Rayleigh waves include the impulse and the comb methods. The impulse technique involves the use of a piezoelectric crystal to apply a stress pulse directly to the test material surface. The stress pulse from the transducer arises by placement of a large, pulsed dc voltage across the transducer. In the comb technique, a series of alternating projections and slots, with a width half a Rayleigh wavelength, are positioned on the test surface and a transducer is placed atop this structure. The transducer is then excited by high voltage pulses. In these different methods, there is an inherent maximum frequency limit of approximately 20 MHz in the impulse method and 50 MHz in the comb method.

It is therefore an object of the invention to provide an ultrasonic testing device using a single crystal metal wedge capable of producing Rayleigh waves to examine the surface region of a test material for flaws and inhomogeneities.

It is a further object of the invention to provide an ultrasonic testing device using a single crystal metal wedge capable of producing Rayleigh waves of very high frequency and corresponding small wavelength to permit fine level resolution of flaws and inhomogeneities.

It is another object of the invention to provide an ultrasonic testing device using a single crystal wedge of metal selected from a particular part of the periodic table and capable of producing Rayleigh waves to examine the surface region of a test material for flaws and inhomogeneities.

It is also an object of the invention to provide an ultrasonic testing device using a single crystal metal wedge capable of transmitting Rayleigh waves with a narrow angle of divergence.

Additional objects, advantages and novel features of the invention will be set forth in part in the description which follows, and in part will become apparent to those skilled in the art upon examination of the following or may be learned by practice of the invention. The objects and advantages of the invention may be realized and attained by means of the instrumentalities and combinations particularly pointed out in the appended claims.

SUMMARY OF THE INVENTION

In an ultrasonic testing device, Rayleigh surface waves may be generated to probe the near-surface region of a solid material for flaws and inhomogeneities. By the use of particular single crystal metal wedges, Rayleigh waves may be generated with very high frequency and narrow angular divergence.

DETAILED DESCRIPTION OF THE PREFERRED EMBODIMENT

Figure 1:
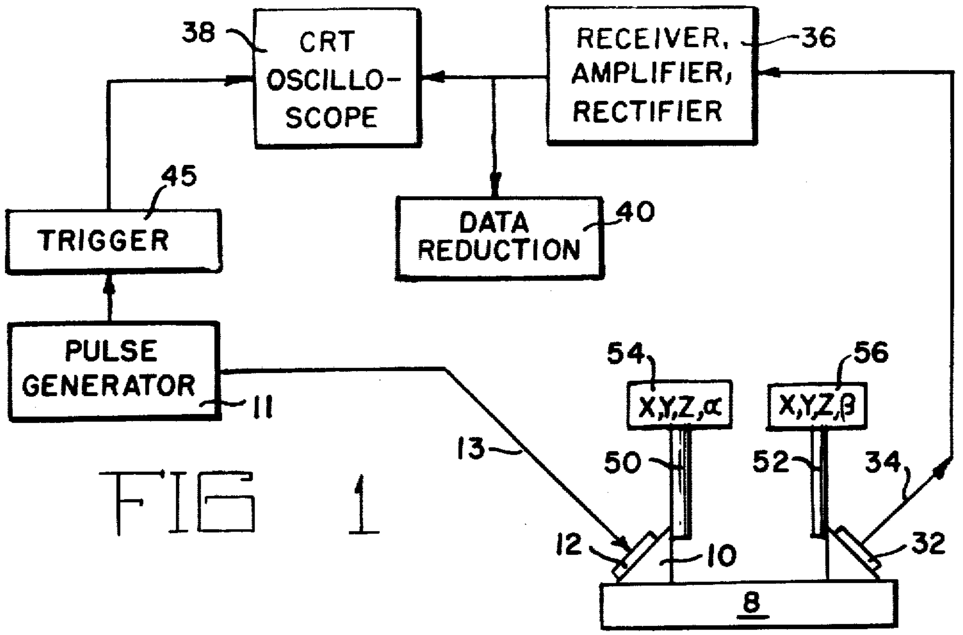
FIG. 1 is a schematic of the non-destructive testing device.
Figure 2:
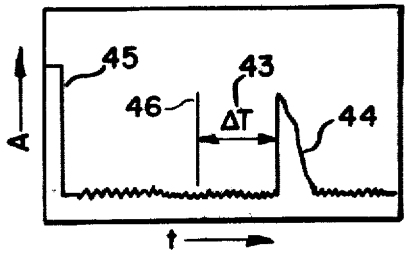
FIG. 2 is a CRT oscilloscope output of a detected Rayleigh wave signal.
Figure 3:
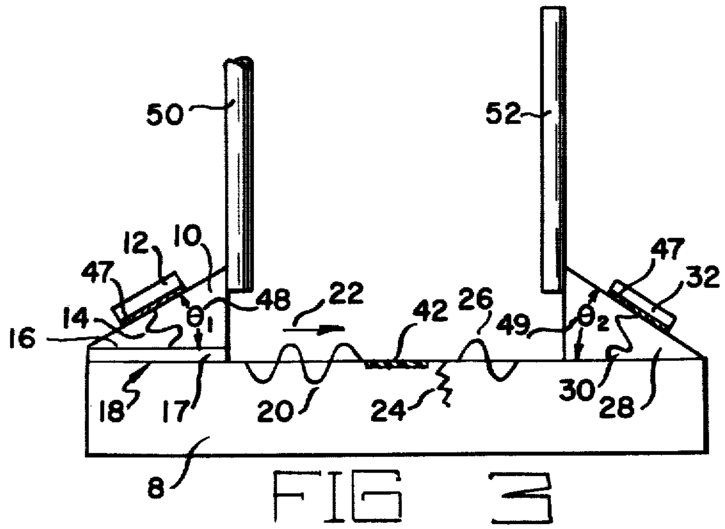
FIG. 3 shows a detail of the transmission and pick-up wedges mounted on a test material surface.

The preferred embodiment is shown in FIGS. 1-3. The device is an acoustic probe directed to the examination of the near-surface region of a solid material by means of Rayleigh surface acoustic waves introduced into the surface of the test material.

As shown in FIGS. 1 and 3, the Rayleigh waves are introduced into test material 8 by single crystal metal wedge 10. In the wedge method, transducer 12 is mounted to wedge 10 and pulse generator 11 applies an electrical pulse 13 to transducer 12 and bulk, acoustic wave 14 is transmitted from transducer 12 into wedge 10. Bulk wave 14 is propagated through surface 16, then through acoustic bonding agent 17, and upon contact with surface 18 of test material 8, wave 14 is converted to Rayleigh surface wave 20, which is then propagated along surface 18 of test material 8 in direction 22.

Rayleigh wave 20 may be utilized to evaluate surface 18 of test material 8 for defects or inhomogeneities such as a crack or ion-implanted layers, provided the wavelength of wave 20 is either the same size or less than a crack or in the case of an inhomogeneous layer, the wavelength may range from less than to greater than the layer depth. Virtually any uniformly shaped geometry may be examined, including such shapes as a cylinder, a plate, or a sphere. Experiments have been successfully performed on specimens with surface finishes characteristic of using 15 $\mu$m particle size polishing medium. As the sensitivity of the technique is improved, it is expected that tests will be performed on increasingly rougher surfaces.

In FIG. 3 is shown a specimen with a crack 24, and Rayleigh wave 20 then will undergo a change in amplitude upon encountering the crack 24 if the crack width is of the same dimension or greater than the wavelengh of Rayleigh wave 20. The transmitted Rayleigh wave 26 is then collected by a detection means which, for example, may be a transducer mounted directly on the surface of test material 8 or a pick-up wedge 28 as shown in FIGS. 1 and 3. The pick-up wedge need not be a single crystal material to function as a detection means. The pick-up wedge 28 of FIGS. 1 and 3 converts wave 26 into bulk mode 30, which is in turn converted by transducer 32 to electrical pulse 34. As shown in FIG. 1, electrical pulse 34 is received, amplified, and rectified by processor 36; and the resultant signal is outputted to CRT display 38 and other data reduction equipment 40. Data reduction equipment 40 may be used to analyze the output wave form from processor 36. Examples of equipment 40 are: (1) a boxcar integrator which digitally records the incoming waveform from processor 36, thereby allowing high precision time delay analysis of the data, and (2) a digital recorder attached to a computer to permit Fourier transformation of the data to allow phase and amplitude evaluation of the data.

It is also possible to operate the device in a reflection mode by making use of reflected bulk wave modes created by conversion of the Rayleigh waves incident upon the defect or inhomogeneity. In this configuration detection means could be placed at various positions on the surface area to be examined, and the strength and direction of the signal would allow evaluation of the surface defects and inhomogeneities.

A second example of an application is also illustrated in FIG. 3 wherein Rayleigh wave 20 encounters ion implanted layer 42, which gives rise to detectable alterations of the elastic constants in layer 42 of test material 8. Consequently, Rayleigh wave 20 undergoes a change in velocity if the thickness of layer 42 is of the order of the dimension of the wavelength of Rayleigh wave 20. In practice, this technique has demonstrated the ability to detect an arsenic ion implant layer of about 2 $\mu$m thickness in germanium with an arsenic ion concentration of $10^{16}$ atoms/cm$^2$. By increasing the Rayleigh wave frequency, the sampled layer thickness diminishes. Therefore, the dimensions and nature of the depth profile may be examined in detail by monitoring velocity changes as the Rayleigh wave frequency is scanned. Currently, experiments have successfully been performed ranging from the low frequency region of 1–10 MHz to the high frequency domain up to 270 MHz which corresponds to a wavelength of approximately 10 $\mu$m. It is anticipated that frequencies of 750 MHz and a corresponding wavelength near 3 $\mu$m will be attainable in the near future. The present limitations on the frequency are determined by the frequency limit of commercial available pulse generator 11, surface roughness, and energy losses related to the atomic displacements for a given wave propagation direction in a given material.

In this preceding experimental mode, the velocity of Rayleigh wave 20 is measured by evaluating CRT output 38 as shown in FIG. 2, which illustrates peak amplitude A versus time t. In FIG. 2, the $\Delta$T time shift 43 of the Rayleigh wave peak 44 is measured with respect to the internal trigger signal 45 and the known standard zero time mark 46 of test material 8. The zero time mark 46 is established by placing the transmission wedge 10 very close to pick-up wedge 28. The wedges are then separated by an additional distance $\Delta$D, and from a measure of the $\Delta$T time delay in distance $\Delta$D, the Raleigh wave velocity $V_R$ may be obtained from the following relationship, $$V_R = \Delta D / \Delta T$$

Transducer 12 may be a compressional or shear transducer, such as lithium niobate, having fundamental frequencies of 30 MHz or less. In this case, a shear transducer with fundamental frequency of 10 MHz was used for the experimental work with overtones of the fundamental frequency used to generate bulk wave 14. Transducer 12 may be acoustically connected to wedge 10 by a thin layer 47, which may be crystallized phenylsalicylate, cyanoacrylate-ester or copolymer alpha methyl styrene, the last being a viscous couplant, which allows rapid removal and resetting. These bonding materials may also be used as layer 17 to couple metal wedge 10 to test material 8. Experimentation has indicated acoustic coupling on the pick-up side was not so sensitive to the coupling agents used, and a coupling agent was necessary only between transducer 32 and pick-up wedge 28.

In this device, assuming both the transmission wedge 10 and the pick-up wedge 28 are single crystal metal wedges, they must be cut at particular angles. In order to use the wedge technique to generate Rayleigh surface waves, a particular bulk crystal shear wave mode must be available. The appropriate transmission wedge angle 48 is determind by a Snell's law relation, $$\theta_1 = \arc\sin (V_w / V_R)$$

where $V_w$ is the velocity of the bulk wave 14 propagated into wedge 10 and $V_R$ is the velocity of Rayleigh wave 20 in test material 8. This equation establishes angle 48 where the wavelength of bulk mode 14, measured along the contact surface 18 is equal to the wavelength of the Rayleigh wave 20 in surface 18. Angle 48 must be such that a reasonable amplitude fraction of bulk mode 14 will be converted to Rayleigh wave 20. In similar fashion, pick-up wedge 28 must be oriented such that angle 49 satisfies the Snell's law relation in order to effectuate reconversion of any incident surface acoustic wave to bulk wave 30 in pick-up wedge 28.

Examples of wedge materials having a suitable bulk shear mode are tantalum, niobium, vanadium, titanium, zirconium, lead, gold, and palladium single crystals. In addition to pure metals from column Vb and titanium and zirconium of IVb of the periodic table, single phase alloys based on alloys of IVb, Vb, and VIb metals may be utilized as materials for wedge 10, provided the electron per atom ratio of the number of electrons outside the closed shell to the number of atoms is between 4.3 and 5.5. Such single phase alloys may be prepared by equilibrium cooling from the melt if the stable phase is one phase or by quenching from the melt to obtain a meta-stable single phase alloy in those compositional ranges in which multiphase alloys are normally thermodynamically stable. In the case of gold, lead, and palladium, the slow shear modes arise from the weak second neighbor atom central forces rather than any particular electronic structure which is present in the IVb, Vb, VIb elements or any permissible alloy combinations.

By way of illustration, a slow velocity shear mode C' is present in tantalum, such that $\theta_1=36.8°$, assuming a Rayleigh wave velocity of 3,000 meter/second (quite close to the values for structural materials such as aluminum, iron, nickel, titanlum, and molybdenum). There is also a $C_{44}$ bulk mode in tantalum which yields a $\theta_1$ of 48°. In the case of palladium, a C' mode results in $\theta_1=29°$. In niobium, there is a $C_{44}$ bulk mode which gives $\theta_1=37°$, and for gold a C' bulk mode which yields $\theta_1=16.5°$. Similarly, vanadium and lead have suitable bulk shear modes which may be used to generate Rayleigh surface waves. Finally, in both titanium and zirconium there is a $C_{66}$ prism plane shear mode which is appropriate for generating a Rayleigh surface mode.

In general, the efficiency of conversion of bulk acoustic waves into surface acoustic waves is optimized as $\theta_1$ in Snell's Law nears 45°. As $\theta_1$ approaches 0° and 90°, the efficiency of producing surface waves in the test specimen drops off drastically with the vast majority of the bulk acoustic waves being converted to other modes, for example, bulk modes in the test specimen. Transducer 12 is mounted on a (110) crystallographic face in the case of tantalum, and the intersection of this face with surface 18 is parallel to a [100] crystallographic direction of wedge 10.

Another important advantage of high frequency Rayleigh waves is their tendency to remain convergent upon transmission. From Huygen's principle for diffraction of light waves by point sources along an outgoing wave front, $$\sin(\theta/2)=0.6\lambda/a_r$$

where $\theta$ is the total cone angle formed by the diverging wave front, $\lambda$ is the wavelength of the acoustic beam and $a_r$ is the radius of the beam source. Thus, for a frequency of 10 MHz, and $a_r$ of 2 mm, $\theta=10°$, and for a frequency of 100 MHz, $\theta=1°$. This principle has been verified by observing the precision alignment necessary to optimize the signal received by the pick-up wedge 28. From an experiment carried out at 270 MHz frequency, it is estimated that the angle of divergence was approximately 2°-3° for a wedge with a front edge width of 3-4 mm.

As the Rayleigh wave frequency is increased, the alignment of the crystallographic position of the pick-up wedge 28 with the transmission wedge 10 becomes more critical. This highly collimated acoustic beam may be manipulated to the desired divergence by varying $a_r$ and $\lambda$, thereby enabling high precision, angular examination of test specimens for surface flaws or inhomogeneities. FIGS. 1 and 3 show vertical bars 50 and 52 attached to wedges 10 and 28 respectively. Coupled to bars 50 and 52 are various means 54 and 56 to translate and rotate wedges 10 and 28, respectively, thereby enabling scans to be performed of the entire surface of test material 8. As mentioned earlier, pick-up wedge 28 is normally a dry connection to test material 8, but transmission wedge 10 requires some form of coupling to test material 8. By using the viscous coupling material, copolymer alpha methyl styrene, wedge 10 may then be manipulated linearly and rotationally without having to break a solid adhesive bond, such as cyanoacrylate or phenylsalicylate.

The embodiment of the invention in which an exclusive property or privilege is claimed are defined as follows:

1. An acoustic wave source for introducing a Rayleigh wave into a test material comprising: a single crystal metal wedge which, with a transducer mounted thereon, is capable of exciting therein a bulk acoustic wave, said metal wedge having a bulk shear wave mode having a characteristic slow velocity less than a velocity of said Rayleigh wave introduced into the test material.

2. The device of claim 1, wherein said metal wedge is a metal selected from the group consisting of Ti, Zr, V, Nb, Ta, Au, Pd, Pb and single-phase transition metal alloys having a characteristic electron per atom ratio between 4.3 and 5.5.

3. The device of claim 2, wherein said metal wedge generates a Rayleigh wave frequency greater than 30 MHz.

4. The device of claim 3, wherein said metal wedge has a narrow width transmission edge, thereby producing a highly collimated Rayleigh wave beam.

5. The device of claim 4 wherein said Rayleigh wave frequency and said narrow width transmission edge are chosen to yield an angular divergence of less than 5° of arc for said highly collimated Rayleigh wave beam.

* * * * *